United States Patent [19]
Yamada

[11] Patent Number: 5,099,133
[45] Date of Patent: Mar. 24, 1992

[54] CHARGED PARTICLE BEAM EXPOSURE METHOD AND APPARATUS

[75] Inventor: Akio Yamada, Kawasaki, Japan

[73] Assignee: Fujitsu Limited, Kawasaki, Japan

[21] Appl. No.: 669,988

[22] Filed: Mar. 15, 1991

[30] Foreign Application Priority Data

Mar. 20, 1990 [JP] Japan ................................ 2-72331

[51] Int. Cl.⁵ .............................................. H01J 37/04
[52] U.S. Cl. .................................. 250/492.2; 250/398; 250/400
[58] Field of Search ................. 250/492.2 R, 492.22, 250/492.23, 396, 398, 400; 219/121.25, 121.26

[56] References Cited

U.S. PATENT DOCUMENTS

| | | | |
|---|---|---|---|
| 4,140,913 | 2/1979 | Anger et al. | 250/398 |
| 4,145,597 | 3/1979 | Yasuda | 250/396 R |
| 4,169,230 | 9/1979 | Bohler | 250/400 |
| 4,213,053 | 7/1980 | Pfeiffer | 250/398 |
| 4,914,304 | 4/1990 | Koyama | 250/492.2 |
| 5,036,209 | 7/1991 | Kataoka et al. | 250/492.2 |

FOREIGN PATENT DOCUMENTS

| | | | |
|---|---|---|---|
| 0113220 | 7/1987 | Japan | 250/492.22 |
| 0321647 | 12/1989 | Japan | 250/492.2 |

Primary Examiner—Jack I. Berman
Assistant Examiner—James E. Beyer
Attorney, Agent, or Firm—Staas & Halsey

[57] ABSTRACT

A charged particle beam exposure method is used for exposing a pattern on an exposing surface using a charged particle beam which has a rectangular cross sectional shape and is deflected to pass through a stencil mask which has a plurality of apertures for forming the rectangular cross sectional shape of the charged particle beam into predetermined stages. The method includes the steps of storing, prior to an exposure process, deflection data indicative of a deflection quantity of the charged particle beam for forming the rectangular cross sectional shape of the charged particle beam into a shape of a desired size. In addition, the method includes detecting, after start of the exposure process, a position of the charged particle beam on the stencil mask relative to the predetermined aperture. The method further includes calculating deflection correction data so that the charged particle is deflected to the reference position on the stencil mask and a deflection quantity of the charged particle beam is calibrated. Finally, the method includes correcting the stored deflection data based on the calculated deflection correction data when making the exposure process using the predetermined aperture of the stencil mask.

19 Claims, 5 Drawing Sheets

CHARGED PARTICLE BEAM EXPOSURE METHOD AND APPARATUS

BACKGROUND OF THE INVENTION

The present invention generally relates to charged particle beam exposure methods and apparatuses, and more particularly to a charged particle beam exposure method which is used for producing large scale integrated circuits (LSIs) and an apparatus which employs such a charged particle beam exposure method.

Recently, in order to further improve the integration density of integrated circuits (ICs), charged particle beam exposure methods which use an electron beam or the like are replacing the conventional photolithography technique when forming fine patterns.

FIG. 1 shows an essential part of an example of a proposed electron beam exposure apparatus. The proposed electron beam exposure apparatus includes an electron gun 1 which emits an electron beam 2, a rectangular beam shaping aperture 4, a lens 5, a deflector 6, input deflectors 8 and 9, a stencil mask 10, output mask deflectors 11 and 12, a mask deflector driving circuit 13, a lens 14, blanking electrodes 15, a reduction lens 16, a round aperture 17, projection lenses 18 and 19, deflectors 20, and a stage 22 on which a wafer 21 is placed. An optical axis is noted by a numeral 3. The lens 7 forms the electron beam 2 into a parallel electron beam, and the lens 14 converges the parallel electron beam.

In this electron beam exposure apparatus, the electron beam 2 emitted from the electron gun 1 is accelerated by an acceleration voltage which is applied across a cathode and an anode and is formed into a beam having a rectangular cross section by the rectangular beam shaping aperture 4. The shaped beam is passed through the lens 5 and the deflector 6 and is formed into the parallel electron beam by the lens 7. The parallel electron beam is deflected by the input mask deflectors 8 and 9 and passes through an aperture which is formed in the stencil mask 10. The input mask deflector 9 deflects the parallel electron beam in a direction parallel to the optical axis 3, that is, in a direction perpendicular to the stencil mask 10. The parallel electron beam is returned onto the optical axis 3 by the output mask deflector 11, and is further deflected by the output mask deflector 12. Deflector 12 matches or continues the irradiating direction of the parallel electron beam to the optical axis 3, and the parallel electron beam is thereafter converged by the lens 14. The parallel electron beam then passes through the blanking electrodes 15, the reduction lens 16, the round aperture 17, the projection lenses 18 and 19 and the deflectors 20 and is irradiated onto the wafer 21.

For example, the stencil mask 10 has a structure shown in FIG. 2. The stencil mask 10 shown in FIG. 2 includes apertures 23 through 31 which are used for forming patterns, and apertures 32 through 35 which are used for calibrating the deflection quality i.e. amount or extent of the electron beam 2. The aperture 23 is used to form the cross sectional shape of the electron beam 2 into a rectangle having an arbitrary size. The apertures 24 through 27 are used to form the cross sectional shape of the electron beam 2 into a basic shape of a repetition pattern. The apertures 28 through 31 are used to form the cross sectional shape of the electron beam 2 into a triangle having an arbitrary size.

FIG. 3 shows a part of the stencil mask 10 having the aperture 28. By deflecting the electron beam 2 as indicated by an arrow in FIG. 3, it is possible to form the cross sectional shape of the electron beam 2 into a triangle of a desired size.

When drawing a repetition pattern on the wafer 21 using the apertures 24 through 27, it is simply necessary to irradiate the electron beam 2 onto the stencil mask 10 so that the electron beam 2 irradiates one of the apertures 24 through 27 at one time. In other words, the electron beam 2 simply needs to generally irradiate a rectangular region indicated by a phantom or dashed line in FIG. 2. For this reason, the calibration of the deflection quantity of the electron beam 2 need not be extremely accurate.

On the other hand, when drawing a triangular pattern of a desired size on the wafer 21 using the apertures 28 through 31, the calibration of the deflection quantity of the electron beam 2 must be extremely accurate because the size of the triangular shape changes depending on the irradiating position of the electron beam 2 on the stencil mask 10. The calibration of the deflection quantity of the electron beam 2 is desirably carried out when forming the triangular patterns, or other variable non-rectangular patterns and the like taking into consideration the rise in temperature within the electron beam exposure apparatus after the start of the exposure, the charge-up of the apparatus and the like are considered. In other words, the apertures 24 through 31 of the stencil mask 10 for forming the non-rectangular patterns are generally located at the peripheral part of the stencil mask 10, while the aperture 23 for forming the rectangular pattern is generally located at the central part of the stencil mask 10 because rectangular patterns are used more often. However, at the peripheral part of the stencil mask 10, the position of the electron beam 2 is more likely to deviate in response to the temperature change and the charge-up since the electron beam 2 is deflected over a relatively large range.

In the conventional electron beam exposure apparatus, the calibration of the deflection quantity of the electron beam 2 is carried out using the calibration apertures 32 through 35 of the stencil mask 10. In order to ensure accuracy, such a calibration must be made quite frequently. However, there is a problem in that the calibration of the deflection quantity of the electron beam 2 using the calibration apertures 32 through 35 requires a complex and time-consuming process. As a result, the throughput of the electron beam exposure apparatus becomes poor.

SUMMARY OF THE INVENTION

Accordingly, it is a general object of the present invention to provide a novel and useful charged particle beam exposure method and apparatus in which the problems described above are eliminated.

Another and more specific object of the present invention is to provide a charged particle beam exposure method for exposing a pattern on an exposing surface using a charged particle beam which has a rectangular cross section and is deflected to pass through a selected aperture of a stencil mask which has a plurality of apertures for forming the cross sectional shape of the charged particle beam respective predetermined shapes, wherein the apertures of the stencil mask include at least a predetermined aperture. The charged particle beam exposure method comprises the steps of storing, prior to an exposure process deflection data indicative of a deflection quantity of the charged particle beam for forming the cross sectional shape of the charged particle beam into a shape of a desired size using the respective predetermined aperture of the stencil mask with reference to a reference deflection quantity with which a cross sectional area of the charged particle beam passing through the predetermined aperture becomes zero, detecting, after start of the exposure process, the position of the charged particle beam on the stencil mask relative to the predetermined aperture when the charged particle beam is deflected by the reference deflection quantity so as to obtain an error between the detected position of the charged particle beam on the stencil mask and a reference position where the cross sectional area of the charged particle beam passing through the predetermined aperture becomes zero, calculating, based on the obtained error, deflection correction data for correcting the reference deflection quantity so that the charged particle beam is deflected to the reference position or target on the stencil mask and a deflection quantity of the charged particle beam is calibrated, and correcting the stored deflection data based on the calculated deflection correction data when making the exposure process using the predetermined aperture of the stencil mask. According to the charged particle beam exposure method of the present invention, it is possible to calibrate the deflection quantity of the charged particle beam within a short time without the need to use calibration apertures of the stencil mask used exclusively for the calibration. Accordingly, it is possible to considerably improve the throughput of the charged particle beam exposure apparatus.

Still another object of the present invention is to provide a charged particle beam exposure apparatus comprising means for forming a cross sectional shape of a charged particle beam into a rectangular shape, a stencil mask having a plurality of apertures for selectively forming the cross sectional shape of the charged particle beam into respective predetermined shapes, wherein the apertures include at least a predetermined aperture, deflecting means responsive to deflection data for deflecting the charged particle beam onto an arbitrary position on the stencil mask and for deflecting the charged particle beam passing through the aperture of the stencil mask onto a predetermined path and a stage on which a substrate to be subjected to exposure is mounted, an optical system for irradiating the charged particle beam on the predetermined path onto the substrate when making an exposure process so as to expose an arbitrary pattern depending on the aperture of the stencil mask through which the charged particle beam passes, and memory means for prestoring deflection data indicative of a deflection quantity of the charged particle beam for forming the cross sectional shape of the charged particle beam into a shape of a desired size using the predetermined aperture of the stencil mask with reference to a reference deflection quantity with which a cross sectional area of the charged particle beam passing through the predetermined aperture becomes zero, detecting means for detecting a position of the charged particle beam on the stencil mask relative to the predetermined aperture when the charged particle beam is deflected by the reference deflection quantity so as to obtain an error between the detected position of the charged particle beam on the stencil mask and a reference position where the cross sectional area of the charged particle beam passing through the predetermined aperture becomes zero, calculating means responsive to the obtained error for calculating a deflection correction data for correcting the reference deflection quantity so that the charged particle beam is deflected to the reference position on the stencil mask and a deflection quantity of the charged particle beam is calibrated, and correcting means for correcting the deflection data prestored in the memory means based on the calculated deflection correction data when making the exposure process using the predetermined aperture of the stencil mask.

Other objects and further features of the present invention will be apparent from the following detailed description when read in conjunction with the accompanying drawings.

DESCRIPTION OF THE PREFERRED EMBODIMENTS

Figure 4A:
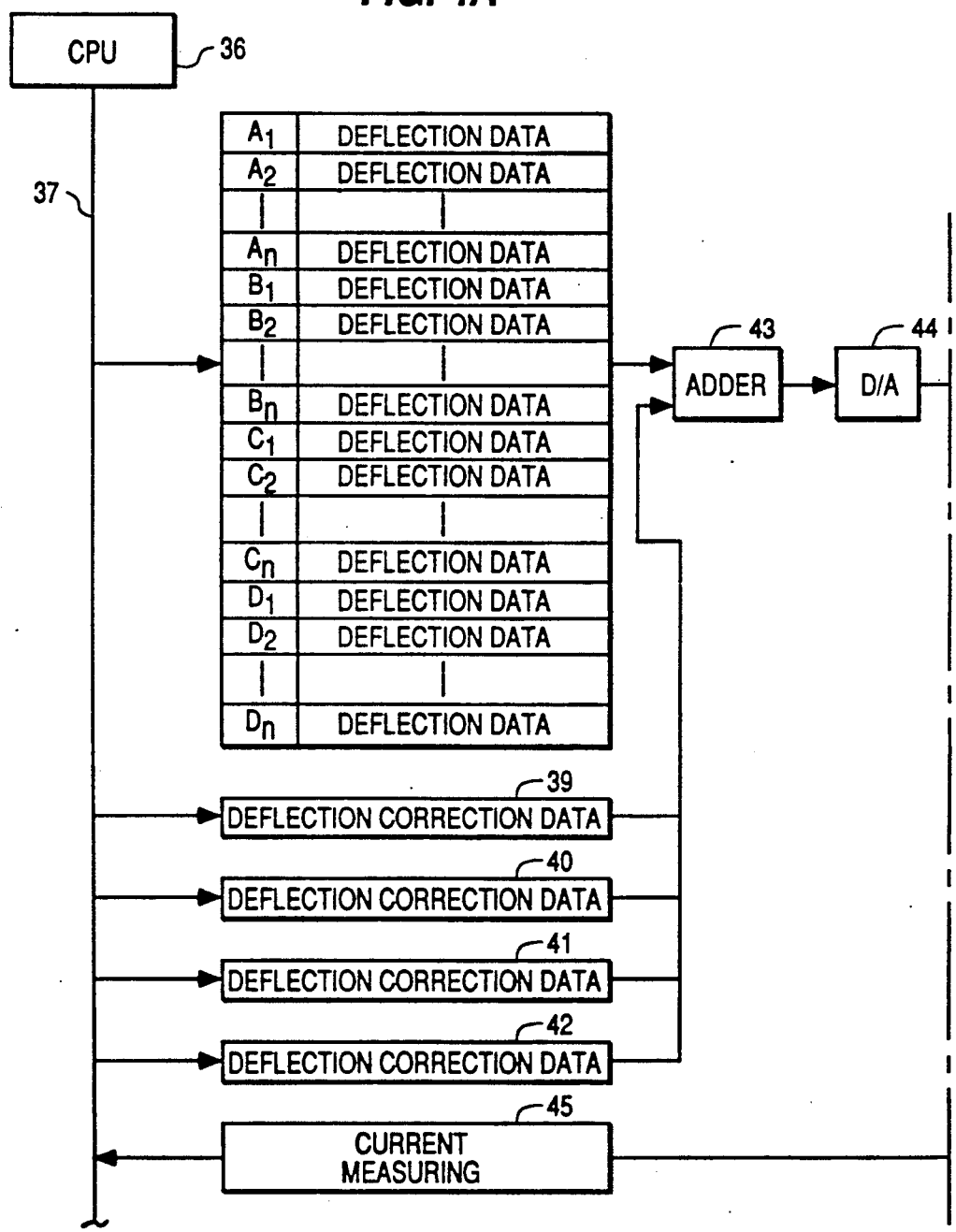
FIGS. 4A and 4B generally show an embodiment of a charged particle beam exposure apparatus according to the present invention.
Figure 4B:
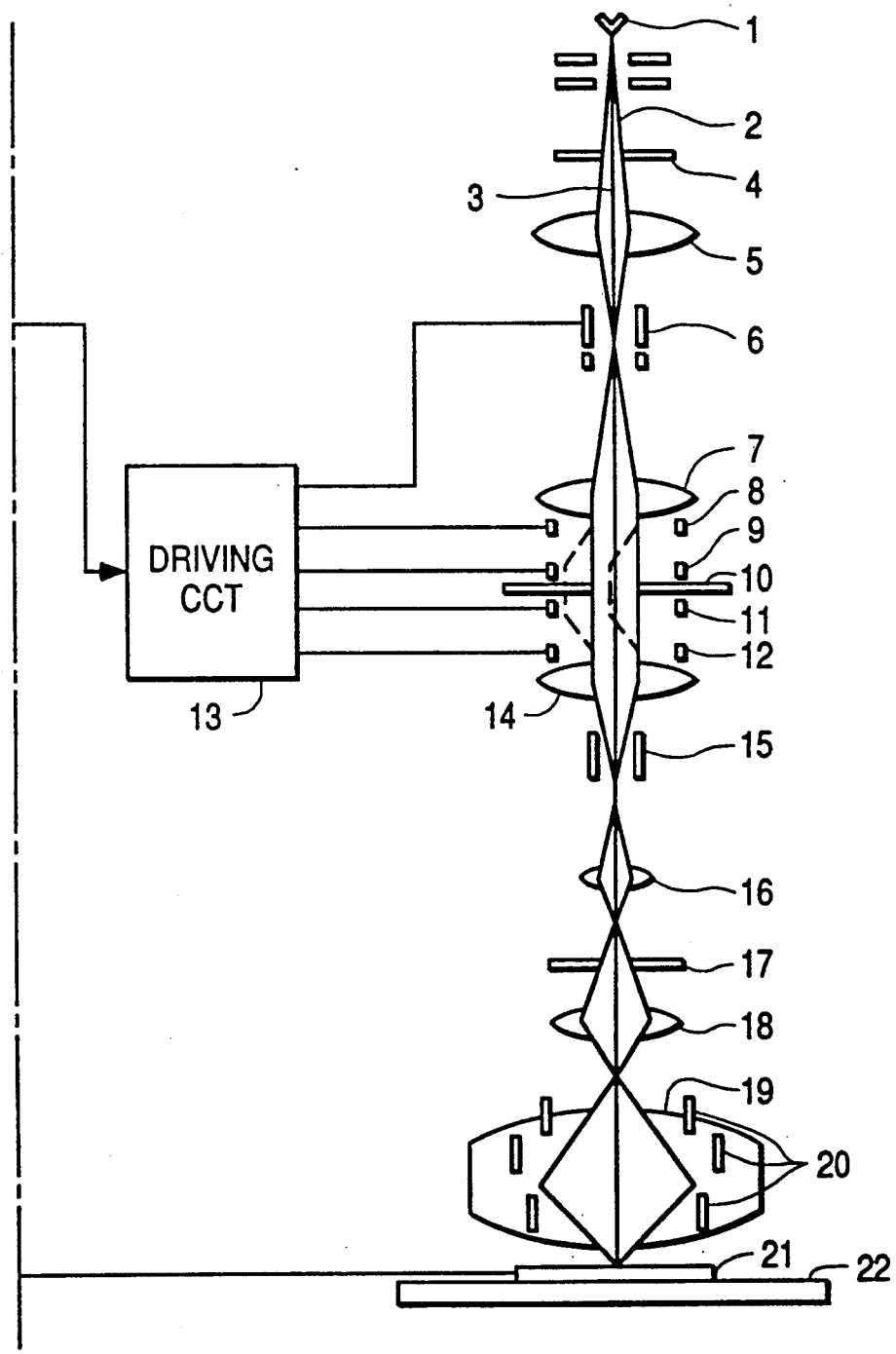

A description will be given of an embodiment of a charged particle beam exposure apparatus according to the present invention, by referring to FIGS. 4A and 4B. This embodiment of the charged particle beam exposure apparatus employs an embodiment of a charged particle beam exposure method according to the present invention. In this embodiment, the charged particle beam exposure apparatus is an electron beam exposure apparatus. In FIGS. 4A and 4B, those parts which are the same as those corresponding parts in FIG. 1 are designated by the same reference numerals, and a description thereof will be omitted.

Figure 1:
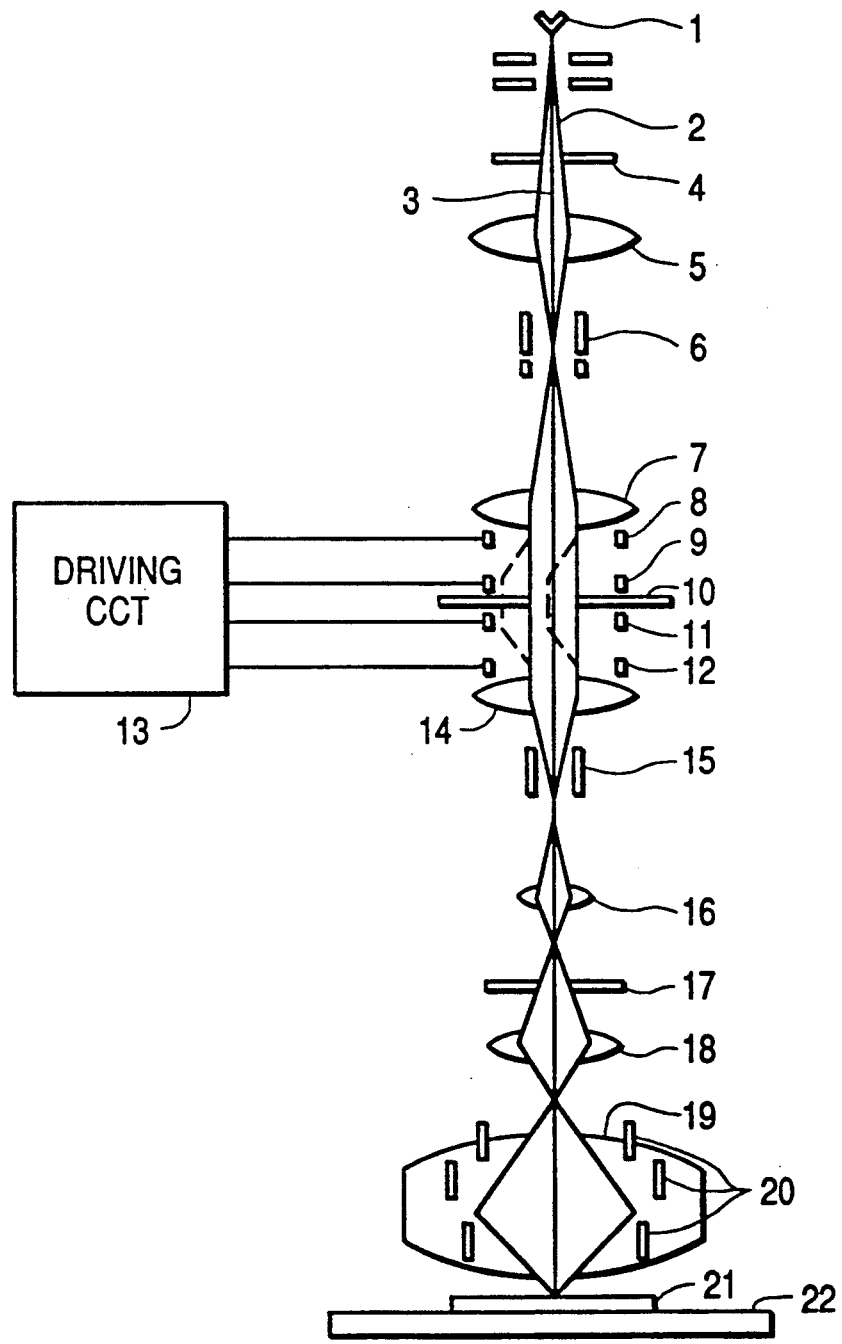
FIG. 1 is a diagram of an essential part of an example of a conventional electron beam exposure apparatus.

The electron beam exposure apparatus shown in FIGS. 4A and 4B includes in addition to those elements shown in FIG. 1 a central process unit (CPU) 36, a bus line 37, a deflection data storage 38, deflection correction data storages 39 through 42, an adder 43, a digital-to-analog (D/A) converter 44, and an electron beam current measuring device 45 which measures the current value of electron beam 2 which is irradiated onto wafer 21. The deflection data storage 38 stores deflection data which are necessary to form the cross sectional shape of the electron beam 2 into triangles of desired sizes. The deflection correction data storages 39 through 42 store deflection correction data for correcting the deflection quantity of the electron beam 2 based on the deflection data stored in the deflection data storage 38. The adder 43 adds the deflection data and the deflection correction data. The D/A converter 44 converts a digital output signal of the adder 43 into an analog signal. The deflection data and the deflection correction data are supplied to the deflectors 6, 8, 9, 11 and 12 via the adder 43, the D/A converter 44 and the mask deflector driving circuit 13. Other parts of the electron beam exposure apparatus shown in FIGS. 4A and 4B are basically the same as these of the conventional electron beam exposure apparatus shown in FIG. 1.

Figure 5A:
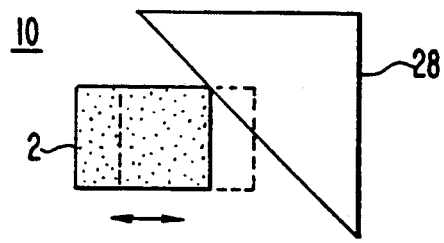
FIGS. 5A through 5D are diagrams for explaining a positional relationship between an aperture of a stencil mask and an electron beam.
Figure 5B:
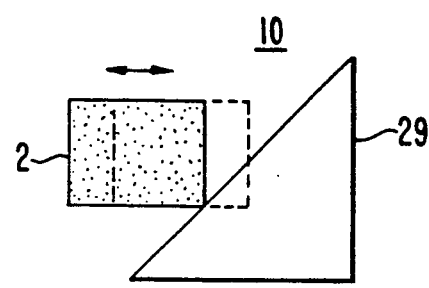
Figure 5C:
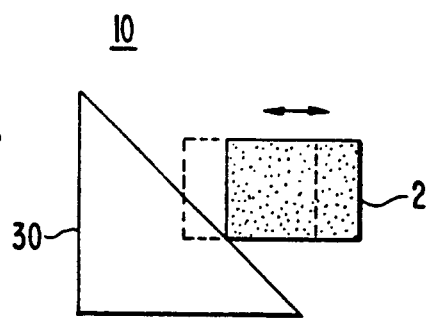
Figure 5D:
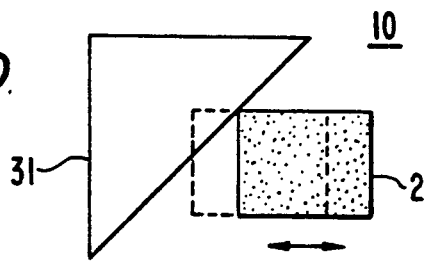

In the deflection data storage 38 shown in FIGS. 4A and 4B, $A_1$ through $D_n$ denote addresses. The deflection data required to form the cross sectional shape of the electron beam 2 into triangles of desired sizes using the aperture 28 of the stencil mask 10 shown in FIG. 5A are stored at the addresses $A_1$ through $A_n$. The deflection data required to form the cross sectional shape of the electron beam 2 into triangles of desired sizes using the aperture 29 of the stencil mask 10 shown in FIG. 5B are stored at the addresses $B_1$ through $B_n$. The deflection data required to form the cross sectional shape of the electron beam 2 into triangles of desired sizes using the aperture 30 of the stencil mask 10 shown in FIG. 5C are stored at the addresses $C_1$ through $C_n$. In addition, the deflection data required to form the cross sectional shape of the electron beam 2 into triangles of desired sizes using the aperture 31 of the stencil mask 10 shown in FIG. 5D are stored at the addresses $D_1$ through $D_n$.

When forming the cross sectional shape of the electron beam 2 into a triangle of a desired size in this embodiment, the following operation is carried out before the exposure starts.

First, as shown in FIG. 5A, the deflection data which indicates the deflection quantity of the electron beam 2 for the case where the area of the triangle formed by the aperture 28 of the stencil mask 10 is exactly zero, that is, the spot of the electron beam 2 is hidden by the stencil mask 10, is calculated and stored at the address $A_1$ of the deflection data storage 38. Then, various deflection data necessary for forming the triangles of desired sizes are calculated using this deflection quantity as a reference, and the various deflection data are stored at the addresses $A_2$ through $A_n$ of the deflection data storage 38.

Next, as shown in FIG. 5B, the deflection data which indicates the deflection quantity of the electron beam 2 for the case where the area of the triangle formed by the aperture 29 of the stencil mask 10 is exactly zero, that is, the electron beam 2 is hidden by the stencil mask 10, is calculated and stored at the address $B_1$ of the deflection data storage 38. Then, various deflection data necessary for forming the triangles of desired sizes are calculated using this deflection quantity as a reference, and the various deflection data are stored at the addresses $B_2$ through $B_n$ of the deflection data storage 38.

In addition, as shown in FIG. 5C, the deflection data which indicates the deflection quantity of the electron beam 2 for the case where the area of the triangle formed by the aperture 30 of the stencil mask 10 is exactly zero, that is, the electron beam 2 is hidden by the stencil mask 10, is calculated and stored at the address $C_1$ of the deflection data storage 38. Then, various deflection data necessary for forming the triangles of desired sizes are calculated using this deflection quantity as a reference, and the various deflection data are stored at the addresses $C_2$ through $C_n$ of the deflection data storage 38.

Furthermore, as shown in FIG. 5D, the deflection data which indicates the deflection quantity of the electron beam 2 for the case where the area of the triangle formed by the aperture 31 of the stencil mask 10 is exactly zero, that is, the electron beam 2 is hidden by the stencil mask 10, is calculated and stored at the address $D_1$ of the deflection data storage 38. Then, various deflection data necessary for forming the triangles of desired sizes are calculated using this deflection quantity as a reference, and the various deflection data are stored at the addresses $D_2$ through $D_n$ of the deflection data storage 38.

At this point in time, the contents of the deflection correction data storage 39 are cleared.

After the exposure starts, the calibration of the deflection quantity of the electron beam 2 is carried out as follows when the cross sectional shape of the electron beam 2 is to be formed into a triangle of a desired size using the aperture 28 of the stencil mask 10, for example.

First, the stage 22 is moved to a position for measuring a current value. Thereafter, the aperture 28 of the stencil mask 10 is selected, and the electron beam 2 is deflected using the deflection data which is stored at the address $A_1$ of the deflection data storage 38. In this case, when the spot of the electron beam 2 overlaps a part of the aperture 28 as indicated by a broken line in FIG. 5A, a current value corresponding to the overlapping area where the electron beam 2 passes through aperture 28 is measured by the electron beam current measuring device 45. Hence, based on the measured current value, the CPU 36 supplies to the deflection correction data storage 39 deflection correction data which makes the current value of the electron beam 2 exactly zero. This deflection correction data is supplied to the adder 43 and is added to the deflection data. As a result, the spot of the electron beam 2 is completely hidden by the stencil mask 10, and the deflection quantity of the electron beam 2 is accurately calibrated.

Next, the stage 22 is moved to an exposure position where the exposure is to take place with respect to the wafer 21. The deflection data necessary for forming the triangles of the desired sizes which are used for the exposure are read out from the addresses $A_2$ through $A_n$ of the deflection data storage 38 and supplied to the adder 43. As a result, the cross sectional shape of the electron beam 2 is accurately formed into corresponding triangles of the desired sizes.

When deflecting the electron beam 2 using the deflection data which is stored at the address $A_1$ of the deflection data storage 38, the electron beam 2 is first deflected so that the spot of the electron beam 2 overlaps or radiates through a part of the aperture 28 if the spot of the electron beam 2 is completely hidden or blocked by the stencil mask 10 before deflection. Thereafter, the deflection quantity of the electron beam 2 is calibrated similarly as described above.

In addition, the deflection quantity of the electron beam 2 is calibrated similarly as described above when forming the cross sectional shape of the electron beam 2 into corresponding triangles of the desired sizes using the apertures 29 through 31 of the stencil mask 10.

According to this embodiment, the calibration apertures 32 through 35 of the stencil mask 10 are not used when calibrating the deflection quantity of the electron beam 2. Instead, the calibration is made by detecting the position of the electron beam 2 with respect to the apertures 28 through 31. Accordingly, the calibration of the deflection quantity of the electron beam 2 can be carried out within a short time, and it is therefore possible to improve the throughput of the electron beam exposure apparatus.

Figure 2:
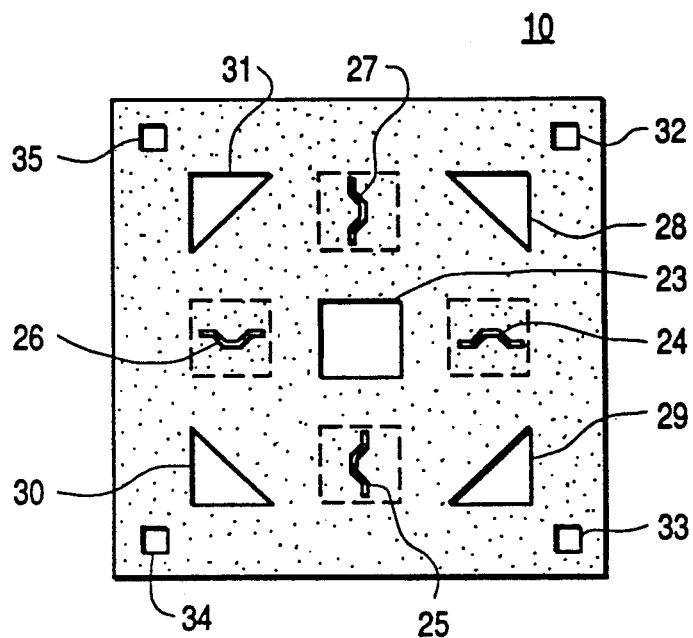
FIG. 2 is a plan view showing a stencil mask used in the electron beam exposure apparatus shown in FIG. 1.
Figure 3:
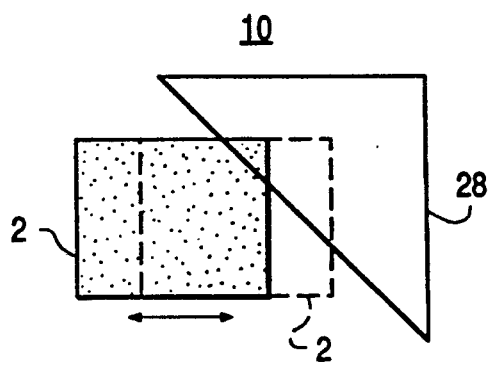
FIG. 3 is a diagram for explaining a positional relationship between an aperture of the stencil mask and an electron beam.

Of course, the deflection quantity of the electron beam 2 may be calibrated using apertures other than the triangular apertures 29 through 31 of the stencil mask 10. In other words, an aperture such as the aperture 25 of the stencil mask 10 shown in FIG. 2 may also be used for the calibration. In addition, the number of apertures provided in the stencil mask 10 and the arrangement of the apertures are not limited to those shown in FIG. 2, and more than one rectangular apertures may be provided in the stencil mask 10.

Further, the present invention is not limited to these embodiments, but various variations and modifications may be made without departing from the scope of the present invention.

What is claimed is:

1. A charged particle beam exposure method for exposing a pattern on an exposing surface in accordance with an exposure process using a charged particle beam which has a rectangular cross sectional shape and is deflected to pass through a selected one of a plurality of apertures provided in a stencil mask thereby for selectively forming the rectangular cross sectional shape of the charged particle beam into respective predetermined shapes, said apertures of the stencil mask including at least a predetermined aperture shape, said charged particle beam exposure method comprising the steps of:

storing, prior to an exposure process, deflection data indicative of a deflection quantity of the charged particle beam for forming the rectangular cross sectional shape of the charged particle beam into a predetermined shape of a desired size using and corresponding to the shape of the predetermined aperture of the stencil mask with reference to a reference deflection quantity in accordance with which the cross sectional area of the charged particle beam passing through the predetermined aperture becomes zero;

detecting, after start of the exposure process, the position of the charged particle beam on the stencil mask relative to the predetermined aperture when the charged particle beam is deflected by the reference deflection quantity so as to obtain an error between the detected position of the charged particle beam on the stencil mask and the reference position at which the cross sectional area of the charged particle beam passing through the predetermined aperture becomes zero;

calculating, based on the obtained error, deflection correction data for correcting the reference deflection quantity so that the charged particle beam is deflected to the reference position on the stencil mask and thereby calibrating the deflection quantity of the charged particle beam; and correcting the stored deflection data based on the calculated deflection correction data when making the exposure process using the predetermined aperture of the stencil mask.

2. The charged particle beam exposure method as claimed in claim 1, wherein said predetermined aperture of the stencil mask has a non-rectangular shape.

3. The charged particle beam exposure method as claimed in claim 2, wherein said step of storing the deflection data stores the deflection data for each predetermined aperture of the stencil mask.

4. The charged particle beam exposure method as claimed in claim 2, wherein said predetermined aperture of the stencil mask has a triangular shape, and the cross sectional area of the charged particle beam passing through the predetermined aperture is variable depending on the extent of overlap of the charged particle beam and the predetermined aperture.

5. The charged particle beam exposure method as claimed in claim 2, wherein said predetermined aperture is located at a peripheral part of the stencil mask and at least one rectangular aperture is located at a central part of the stencil mask.

6. The charged particle beam exposure method as claimed in claim 1, wherein said reference deflection quantity is obtained by overlapping the charged particle beam and the predetermined aperture of the stencil mask and continuously deflecting the charged particle beam until the extent overlap of the charged particle beam and the predetermined aperture becomes zero.

7. The charged particle beam exposure method as claimed in claim 1, wherein said step of detecting the position of the charged particle beam further comprises the step of detecting a current value of the charged particle beam on the exposure surface when the charged particle beam is deflected by the reference deflection quantity, said current value indicating an overlap of the charged particle beam and the predetermined aperture of the stencil mask.

8. The charged particle beam exposure method as claimed in claim 1, wherein said charged particle beam is an electron beam.

9. A charged particle beam exposure apparatus using a charged particle beam comprising:

means for forming a cross sectional shape of the charged particle beam into a rectangular cross sectional shape;

a stencil mask having a plurality of apertures for forming the rectangular cross sectional shape of the charged particle beam into predetermined shapes, said apertures including at least a predetermined aperture;

deflecting means responsive to deflection data for deflecting the charged particle beam onto an arbitrary position on said stencil mask and for deflecting the charged particle beam passing through the aperture of said stencil mask onto a predetermined path;

a stage on which a substrate to be subjected to exposure is mounted;

an optical system for irradiating the charged particle beam on the predetermined path onto the substrate when making an exposure process so as to expose an arbitrary pattern depending on the aperture of said stencil mask through which the charged particle beam passes;

memory means for prestoring deflection data indicative of a deflection quantity of the charged particle beam for forming the rectangular cross sectional shape of the charged particle beam into a predetermined shape of a desired size using and corresponding to the shape of the predetermined aperture of the stencil mask with reference to a reference deflection quantity in accordance with which the cross sectional area of the charged particle beam passing through the predetermined aperture becomes zero;

detecting means for detecting a position of the charged particle beam on the stencil mask relative to the predetermined aperture when the charged particle beam is deflected by the reference deflection quantity so as to obtain an error between the detected position of the charged particle beam on the stencil mask and the reference position at which the cross sectional area of the charged particle beam passing through the predetermined aperture becomes zero;

calculating means responsive to the obtained error for calculating deflection correction data for correcting the reference deflection quantity so that the charged particle beam is deflected to the reference position on the stencil mask and thereby calibrating the deflection quantity of the charged particle beam; and correcting means for correcting the deflection data prestored in said memory means based on the calculated deflection correction data when making the exposure process using the predetermined aperture of the stencil mask.

10. The charged particle beam exposure apparatus as claimed in claim 9, wherein said calculating means stores the deflection correction data in said memory means.

11. The charged particle beam exposure apparatus as claimed in claim 10, wherein said correcting means includes an adder for adding the deflection data and the deflection correction data read from said memory means.

12. The charged particle beam exposure apparatus as claimed in claim 9, wherein said predetermined aperture of the stencil mask has a non-rectangular shape.

13. The charged particle beam exposure apparatus as claimed in claim 12, wherein said memory means prestores the deflection data for each predetermined aperture of the stencil mask.

14. The charged particle beam exposure apparatus as claimed in claim 12, wherein said predetermined aperture of the stencil mask has a triangular shape, and the cross sectional area of the charged particle beam passing through the predetermined aperture is variable depending on the extent of overlap of the charged particle beam and the predetermined aperture.

15. The charged particle beam exposure apparatus as claimed in claim 12, wherein said predetermined aperture is located at a peripheral part of the stencil mask and at least one rectangular aperture is located at a central part of the stencil mask.

16. The charged particle beam exposure apparatus as claimed in claim 9, which further comprises means for controlling said deflecting means to obtain said reference deflection quantity by overlapping the charged particle beam and the predetermined aperture of the stencil mask and continuously deflecting the charged particle beam until the extent of overlap of the charged particle beam and the predetermined aperture becomes zero.

17. The charged particle beam exposure apparatus as claimed in claim 9, wherein said detecting means further comprises the step of detecting a current value of the charged particle beam on the stage when the charged particle beam is deflected by the reference deflecting quantity, said current value indicating the extent of overlap of the charged particle beam and the predetermined aperture of the stencil mask.

18. The charged particle beam exposure apparatus as claimed in claim 9, wherein said charged particle beam is an electron beam.

19. The charged particle beam exposure apparatus as claimed in claim 9, wherein said deflecting means includes a plurality of deflectors for deflecting the charged particle beam at a plurality of positions along a propagating path of the charged particle beam.

* * * * *

UNITED STATES PATENT AND TRADEMARK OFFICE
CERTIFICATE OF CORRECTION

PATENT NO. : 5,099,133
DATED : March 24, 1992
INVENTOR(S) : Akio YAMADA

It is certified that error appears in the above-identified patent and that said Letters Patent is hereby corrected as shown below:

Col. 1, line 58, change "quality i.e." to --quantity, i.e.,--;
line 59, after "extent" insert --,--.

Col. 2, line 25, after "exposure," insert --and--;
line 63, after "beam" insert --into--.

Col. 3, line 44, after "path" insert --,--.

Col. 7, line 3, change "apertures" to --aperture--.

Signed and Sealed this

Twelfth Day of October, 1993

Attest:

BRUCE LEHMAN

Attesting Officer

Commissioner of Patents and Trademarks